United States Patent [19]
Collins et al.

[11] Patent Number: 5,555,528
[45] Date of Patent: Sep. 10, 1996

[54] DYNAMIC RANDOM ACCESS MEMORY PERSISTENT PAGE IMPLEMENTED AS PROCESSOR REGISTER SETS

[75] Inventors: Clive A. Collins, Wappingers Falls; Billy J. Knowles, Kingston; Christine M. Desnoyers, Pine Bush; David B. Rolfe, West Hurley, all of N.Y.; Dale E. Pontius, Colchester, Vt.

[73] Assignee: International Business Machines Corporation, Armonk, N.Y.

[21] Appl. No.: 450,324

[22] Filed: May 25, 1995

Related U.S. Application Data

[62] Division of Ser. No. 289,149, Aug. 12, 1994.

[51] Int. Cl.[6] .................................................... G11C 7/00
[52] U.S. Cl. .......................... 365/227; 365/205; 365/228; 365/229; 365/230.01
[58] Field of Search .................................... 395/425, 400; 365/226, 227, 228

[56] References Cited

U.S. PATENT DOCUMENTS

| | | | |
|---|---|---|---|
| 5,272,677 | 12/1993 | Yamamura | 365/227 |
| 5,287,320 | 2/1994 | Adachi | 365/226 |
| 5,463,585 | 10/1995 | Sanada | 365/201 |

*Primary Examiner*—Viet Q. Nguyen
*Attorney, Agent, or Firm*—Floyd A. Gonzalez; James E. Murray

[57] ABSTRACT

The sense amplifier registers (SARs) servicing the arrays of a dynamic random access memory (DRAM) located on a semiconductor chip with a processor are all maintained at full power while unaccessed arrays are powered down to conserve power. Accessing circuits for the DRAM permit accessing by the processor of word length segments of each of the SARs independently of one another so that the SARs function as a read/write cache for the processor.

4 Claims, 3 Drawing Sheets

DYNAMIC RANDOM ACCESS MEMORY PERSISTENT PAGE IMPLEMENTED AS PROCESSOR REGISTER SETS

This application is a division of application Ser. No. 08/289,149 filed Aug. 12, 1994.

BACKGROUND OF THE INVENTION

1. Field of the Invention

The present invention relates to random access memories particularly to such memories fabricated with microprocessors on a single semiconductor chip.

2. Prior Art

In today's denser dynamic random access memorys (DRAMs) memory cells are arranged in a plurality of small arrays. Each of these arrays has its own set of latches associated with its sense amplifiers. These sets of latches called sense amplifier registers (SARs) are used to access, with a single access, a plurality of memory cells. In such systems, it is common, in order to conserve power, to have any array not in present use, and its associated accessing circuits, powered down to a level that will not permit either reading or writing of data. As a result of this powering down, the average access time of the memory is increased since upon being accessed a powered down array must be powered back up before data may be read out of or written into the array.

In U.S. patent application Ser. No. 510,898 entitled "Integrated Circuit I/O Using a High Performance Bus Interface" and filed on Apr. 18, 1990, it has been suggested that, by selectively pre-charging the sense amplifiers or output latches of powered down arrays, those sense amplifiers and/or latches can be used in what has been called "a poor man's cache" in which data from previous fetches, retained in the sense amplifiers or latches, can be accessed by the processors.

In U.S. patent application Ser. No. 07/887,630 filed May 22, 1992 and entitled "Advanced Parallel Array Processor" (incorporated herein by reference) a relatively large register set is used as a cache for fast temporary storage in the transfer of data between micro processors and memory arrays on the same processor chip. These registers use up significant semiconductor chip real estate.

BRIEF DESCRIPTION OF THE INVENTION

In accordance with the present invention, the use of such separate register sets is avoided. In their place the sense amplifier registers (SARs) of a DRAM are used for fast, temporary storage. The SARs are maintained at full operating power while the memory arrays they service may be powered down. In addition, each SAR is segmented with the segments accessible separately from one another for both reading data out and writing data into the segments without accessing the arrays. With this arrangement, the powering down of the arrays is made transparent to the microprocessor and the SARs are accessed so as to function as a cache which is accessible by the microprocessor at all times. The more arrays that are used in random access memory and the greater the number of individually accessible segments in each SAR, the deeper is the cache that is provided.

Therefore, it is an object of the present invention to provide rapid data transfer to and from random access memory to processors located on the same semiconductor chip.

Another object of the invention is to allow processors to access data in the SARs for random access memory arrays independently of accessing data stored in the arrays themselves.

DESCRIPTION OF THE DRAWINGS

These and other objects of the invention can best be understood by reference in the accompanying figures of which.

DESCRIPTION OF THE PREFERRED EMBODIMENT

Figure 1:
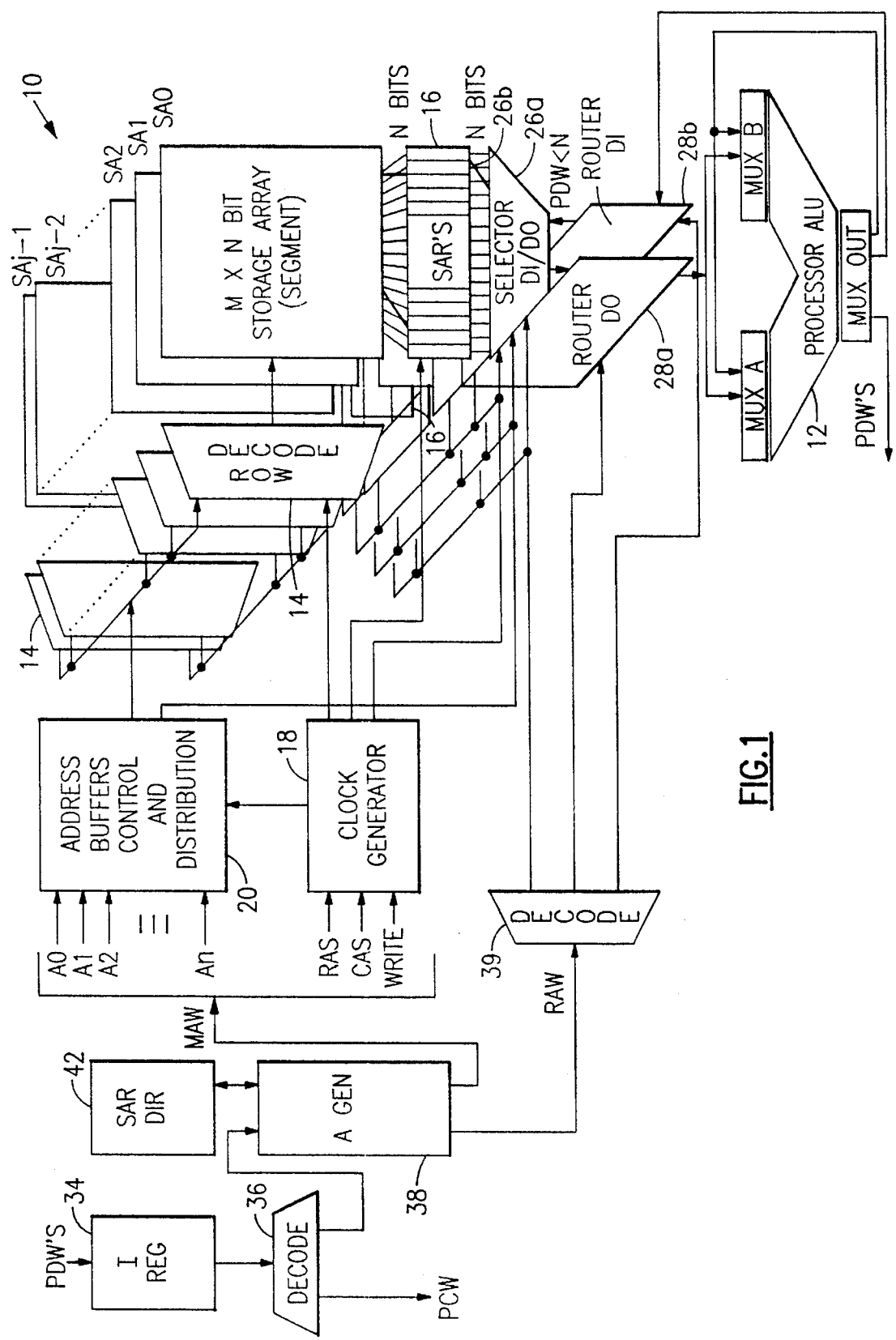
FIG. 1 is a block diagram of logic elements on a semiconductor chip including a processor and a random access memory.

Referring to FIG. 1, the dynamic random access memory (DRAM) 10 has storage cells of the memory arranged in N separate arrays SAO to SAj−1; each array containing M rows of N storage cells each. In the diagram, the first array SAO of the illustrated DRAM is shown in full while the intermediate arrays and the last array SAj−1 are represented by partially visible planes and dots. The arrays SAO to SAj−1, the processor 12, the row decoders 14, the sense amplifier registers 16, the clock generator 18, the address buffers 20, and other logic circuits on the chip are all well known and will be described only to the extent necessary to understand the present invention.

To conserve power, the arrays not in use are powered down (different DRAMs at different times) while the storage address registers 16 are powered up at all times so that the processor 12 can access data in the SARs of the DRAM 10 without concern about whether or not a particular array of the DRAM 10 containing that data is in a powered down state.

Independent access is provided to the SARs 16 by selector circuits 26 and router circuits 28. The router circuits 28 are to select the SAR of one array out of the SARs of all the arrays for reading or writing. The selector circuits are to permit selection of segments of a SAR independently of one another so that data may be entered or changed in one segment, multiple segments, or the whole SAR as required by the processor. There are two sets each of router and selector circuits. One set for entering data in the SAR from the output multiplexer (MUXOUT) of the processor 12 and the other set is to provide data stored in the SARs to the A and B multiplexers (MUX A and MUX B) of the processors.

Figure 2:
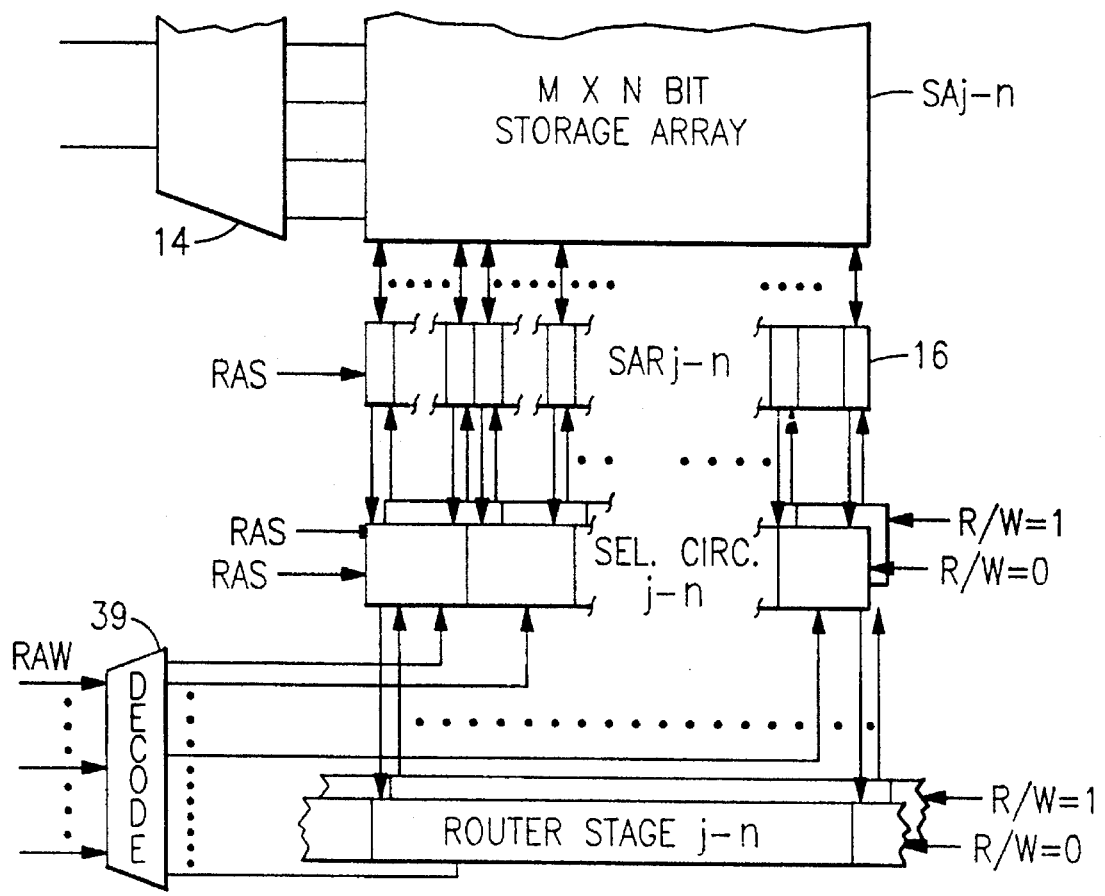
FIG. 2 is a block diagram showing logic circuits to access the SAR in one of the arrays of the random access memory in FIG. 1.

The selector and router circuits and their operation can best be understood by reference to FIG. 2. As shown in that figure, each array segment SAj-n is made up M×N bits for storing M pages of N data bits each with each page stored in a different row of storage cells. The row decoder 14 for the DRAM selects one row in one array on each access. A string of data bits can be entered into the row or read from the row during that access. On being entered into a row or being read from a row of array SAj-n the string of data bits passes through the SARj-n for the array SAj-n. There is one stage in SARj-n for each bit position in the row.

Since only one row of data cells is accessed at a time, the string of data bits in the row can be referred to collectively as a page of data. Data bits in a page are arranged in a number of data words. For instance, if the page contains 256 eight bit bytes it could be divided into 32 words of 8, eight bit bytes each. The selector and routing circuits 26 and 28 respectively are arranged in sets to allow the RAW to access them selectively for reading and writing of individual data words in the page. In the example given, this means that each 8 byte word in a page stored in a SAR can be individually selected by the selector and router circuits 26 and 28 respectively to either read or change the data stored therein. Thus the SARs 16 function as a cache for the processor 12 in which all or part of the last accessed page of any array SAj-n can be obtained or changed without performing a full memory access just as if there was a separate cache to perform this type of access. For this purpose the clock generator 18 provides register address and memory address strobes (RAS and CAS respectively) that can be actuated so that the data in the SARs can be obtained without accessing the array segments.

Figure 3:
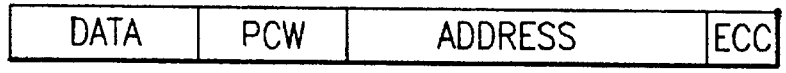
FIG. 3 is a layout for a Processor Data Word (PDW)

Data is stored in the DRAM 10 in processor data words (PDWs). As shown in FIG. 3, a PDW contains data bits, memory address bits, a process control word and ECC bits protecting all the information stored in the PDW.

Figure 4:
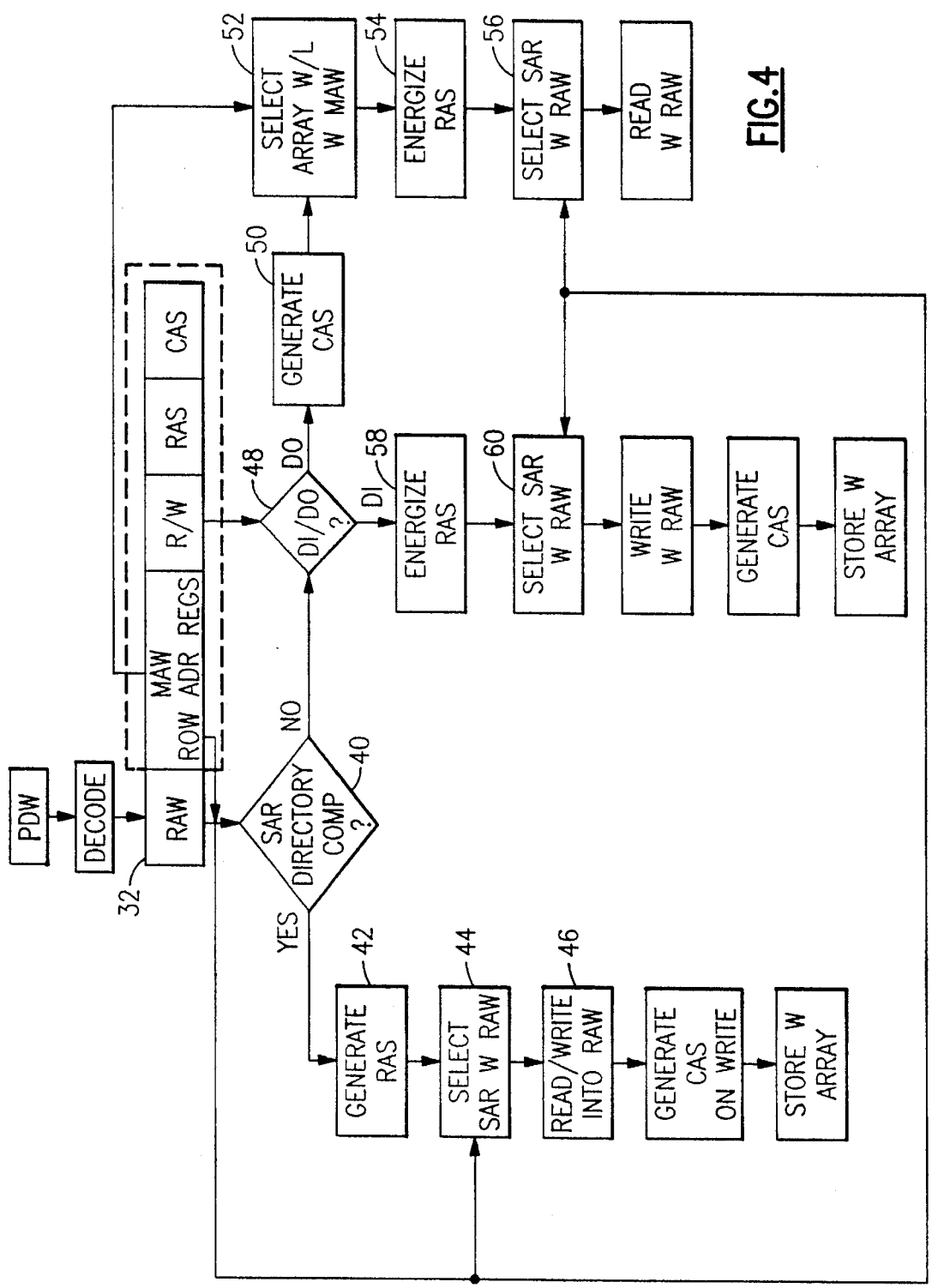
FIG. 4 is a flow diagram illustrating the operation of the memory control logic for the memory in FIG. 1.

Referring to both FIGS. 1 and 4, memory address bits 32 used to access the DRAM are deconstructed, by the decoder 36 and address generator 38, from the PDW stored in the instruction register 34. The generated address bits include a memory access word (MAW) and a register address word (RAW). The RAW contains the address bits of the SARj-n of the array containint the desired page. They are sent to the RAW decoder 39 to activate the appropriate selector and router stages for the selection of SARj-n.

The low order m bits of the MAW, or bits AO to Ai, are the row address bits of the DRAM. These low order bits are provided by the address buffer 20 to each of the row decoders 14 including the row decoded j-n of the array containing the desired page to select one of the M rows in each of the j array segments of the DRAM 10. The MAW also contains three additional bits or bits Ai+1 to Ai+3 which it provides to the clock generator 18. Those bits are the row address strobe (RAS), the column address strobe (CAS) and a read write bit R/W. The CAS and RAS bits determine the timing of the access to the arrays and SARs respectively while the R/W bit determines if data is to be read out of or written into the SAR or DRAM. The R/W bit selects the appropriate one of the router and selector circuit sets DI or DO for writing data in or reading data out of the SARj-n. When R/W is "0" it is a and operation and the DO sets are selected. When it is "1" it is write operation and the DI sets are selected.

Address bits in the PDW are compared 40 with address bits in the SAR directory 42. If this comparison of address bits results in a match, the RAS strobe is generated 42 allowing requested SAR to be accessed directly 44 using the Register Address Word (RAW). Data can then be written into or read out of the SARj-n directly 46 (without first accessing the array SAj-nenough row decoder j-n) by energizing the RAS and using the RAW to select the SAj-2.

If the address of the requested PDW is not found in the SAR directory by the compare 40, it is determined if the operation is a read or write operation. If it is a read operation the CAS is generated 50 and the memory address word (MAW) is used to read the page containing the desired PDW into the SAR 52 where it is accessed as before by energizing the RAS 54 and selecting the appropriate segments of the SARj-n using the RAW. Once the page is in the SAR, it is retained there until a subsequent read or write operation involving a different page from the same array. In the SAR it is available for possible access by the processor during a future request. If a write operation is performed the RAS is energized 58 and the SAR selected 60 just as if the PDW was in the SAR. Write operations always require later entry of data into the array whether or not the selected page was initially in the SAR.

To summarize, the PDW request by the processor is loaded into the instruction register 34. Instruction register 34 is the first-in first-out register where the address portion of the PDW is loaded one at a time into the address generator 38 generating the MAW and RAW addresses as previously described. The address bits of the PDW are compared to corresponding bits stored in the SAR directory 42 to determine if the requested information is stored in one of the SARs. If it is in a SAR 16 the arrays are bypassed and the output buffers are accessed directly with the RAW for both reading and writing. If the address is not in the RAW the arrays and SARs are accessed in the usual manner.

It can be seen from the above described embodiment of the invention that previously accessed data pages retained in the SAR 16 of a DRAM memory can be accessed independently of the accessing of the arrays of the DRAM. A number of modifications can be made in this embodiment. For instance, there may be more than one processor on the semiconductor chip. In which case the DRAM 10 would be divided into separate parts each part accessed exclusively by one of the processors. Another variation would be to access two or more SARs at the same time to increase the page size. Therefore, it should be understood that the invention is not limited to the particular embodiment disclosed but should be interpreted in view of the spirit and scope of the appended claims.

We claim:

1. A random access memory system for storing data in N bit data strings for access by a processor in which the arrays in the memory system are periodically powered down to save power comprising:

a) M memory arrays each storing data in said N bit data strings, said arrays being powered down during periods they are not being accessed;

b) M sense amplifier registers, one such register connected to each of the arrays for storing or reading one said N bit data string for each access of the memory system by the microprocessors, each such register being maintained at full operating power while the array it is connected to is powered down and;

c) access means for accessing said sense amplifier registers separately of each other whereby said registers form a high speed buffer memory where the processor can access data requested during previous memory accesses whether or not any of the M memory arrays of the memory system are powered down.

2. The random access memory system of claim 1 wherein said M sense amplifier registers are each divided into segments with each segment addressable for reading and writing separately from the other segments of the particular sense amplifier register.

3. The random access memory system of claim 1 wherein said access means includes:

d) storage address register directory storing addresses of data strings resident in the sense amplifier registers of said random access memory system; and e) compare means for comparing address bits of addresses of data strings which data strings are to be written into and read out of said random access memory with address bits of the strings of data bits resident in the sense amplifier registers.

4. The random access memory system of claim 3 wherein said access means includes:

f) selection means responsive to the comparison made by the compare means to address the sense amplifier registers to directly access said data strings for reading and writing when they are resident in the storage address registers.

\* \* \* \* \*